United States Patent

Jang

[11] Patent Number: 5,834,816
[45] Date of Patent: Nov. 10, 1998

[54] MOSFET HAVING TAPERED GATE ELECTRODE

[75] Inventor: Seong Jin Jang, Seoul, Rep. of Korea

[73] Assignee: Goldstar Electron Co., Ltd., Chungcheongbuk-Do, Rep. of Korea

[21] Appl. No.: 816,009

[22] Filed: Mar. 10, 1997

Related U.S. Application Data

[63] Continuation of Ser. No. 205,918, Mar. 3, 1994, abandoned, which is a continuation of Ser. No. 959,882, Oct. 13, 1992, Pat. No. 5,298,443.

[30] Foreign Application Priority Data

Oct. 10, 1991 [KR] Rep. of Korea .................. 1991-17727

[51] Int. Cl.⁶ .......................... H01L 29/76; H01L 29/94; H01L 31/062; H01L 23/48
[52] U.S. Cl. .......................... 257/382; 257/384; 257/412; 257/768
[58] Field of Search ..................... 257/288, 368, 257/382, 384, 401, 412, 768, 344

[56] References Cited

U.S. PATENT DOCUMENTS

| | | | |
|---|---|---|---|
| 4,442,591 | 4/1984 | Haken | 29/571 |
| 4,546,535 | 10/1985 | Shepard | 257/382 |
| 4,939,154 | 7/1990 | Shimbo | 437/41 |
| 5,073,510 | 12/1991 | Kwon | 437/40 |
| 5,141,891 | 8/1992 | Arima | 437/44 |
| 5,175,118 | 12/1992 | Yoneda | 437/40 |
| 5,196,357 | 3/1993 | Boardman | 437/40 |

FOREIGN PATENT DOCUMENTS

| | | | |
|---|---|---|---|
| 62-35570 | 2/1987 | Japan | 437/40 |
| 62-147777 | 7/1987 | Japan | 437/40 |
| 62-235783 | 10/1987 | Japan | 437/40 |
| 1-21966 | 1/1989 | Japan | 257/344 |
| 64-764 | 1/1989 | Japan | 257/344 |

*Primary Examiner*—Steven H. Loke
*Attorney, Agent, or Firm*—Loudermilk & Associates

[57] ABSTRACT

A MOSFET comprising a gate oxide layer on a silicon substrate, a polysilicon gate formed on the gate oxide layer, the length of which gradually widens going from bottom to top, a side gate oxide layer formed by an oxidation process surrounding the polysilicon gate, the side gate oxide layer also gradually widening from bottom to top, a source/drain region beside the gate oxide layer, a connection element having a stacked structure of a polysilicon and/or polycide layer on the field oxide, a doped polysilicon side wall beside the side gate oxide layer and making electric connection between the source/drain region and the connection element.

14 Claims, 3 Drawing Sheets

# 5,834,816

MOSFET HAVING TAPERED GATE ELECTRODE

This application is a continuation of application Ser. No. 08/205,918 filed on Mar. 3, 1994 now abandoned, which is a continuation of application Ser. No. 07/959,882, filed on Oct. 13, 1992, now U.S. Pat. No. 5,298,443.

FIELD OF THE INVENTION

The present invention relates to a 0.2 $\mu$m scale MOSFET formed by a self aligned process using conventional photolithography.

BACKGROUND OF THE INVENTION

FIG. 1 illustrates the structure of a MOSFET manufactured by a conventional method. This MOSFET is manufactured in the manner described below.

That is, gate oxide film 85 is formed on silicon substrate 1, a polysilicon film is deposited thereupon, and poly gate 95 is patterned by etching the polysilicon film. An ion implantation process is carried out to form source/drain regions 22. Thereafter, oxide side wall 75 beside poly gate 95 is formed, and then insulating layer 77 (an oxide film) is deposited thereon. Finally, a contact hole is opened, and metallic contacts 79 are formed for making contact with the source/drain regions.

With such a conventional manufacturing process, there are various disadvantages as described below.

First, if a conventional photolithographic process is used and the pattern size is reduced to a very fine scale, optical interference and diffraction effects are increased. Consequently, the resolution is not enough to perform a process for elements of 0.5 $\mu$m scale or below.

Second, even if a phase shifting photolithographic technique is used, a self aligned gate formation process is not utilized, and the characteristics of the MOSFET can become unstable.

Third, even though a 0.2 $\mu$m scale device may be formed, the area of the source/drain regions has to be sufficiently large in order to form the source/drain contacts.

SUMMARY OF THE INVENTION

The present invention is intended to overcome the above described disadvantages of the conventional techniques.

Accordingly, it is an object of the present invention to provide a 0.2 $\mu$m MOSFET and a process for formation thereof, a MOSFET and process in which a self aligned gate formation process is used as well as a conventional photolithographic process.

In achieving the above object, the process for formation of the MOSFET according to the present invention includes the steps of: forming a field oxide layer upon a silicon substrate to define an active region, and depositing layers such as a pad oxide layer, an undoped polysilicon or polycide and a CVD oxide layer in the cited order; defining a region for formation of a MOSFET by using a mask, etching the CVD oxide layer, the undoped polysilicon or polycide and the pad oxide layer by applying a reactive ion etching (RIE) process, and carrying out an ion implantation into the channel; depositing an undoped polysilicon; forming a side wall of the undoped polysilicon by carrying out an RIE process; carrying out an annealing process in order to remedy silicon etch damage, removing an oxide layer grown during the annealing process, oxidizing a gate, and depositing a gate polysilicon; carrying out an RIE process to leave only a part of the gate polysilicon so as for a gate to be formed, and depositing an oxide layer to insulate the gate; carrying out an RIE process on the gate insulating oxide layer, carrying out an RIE process on the polysilicon to etch down to the top of the side wall of the undoped polysilicon to form a flattened surface, and carrying out a source/drain ion implantation to form source/drain regions; forming a contact after depositing an oxide layer, and then depositing a metal layer.

During the RIE etching of the gate insulating oxide layer and the undoped polysilicon, the etch ratio between the oxide layer and the side wall of the undoped polysilicon is desirably set at 1:1.

In achieving the above object, the MOSFET according to the present invention includes: a polysilicon gate formed on a gate oxide layer; a side gate oxide layer formed beside the polysilicon gate with a gradually widening shape; a polysilicon side wall beside the polysilicon gate and the side gate oxide layer; a stack of an oxide layer and a polysilicon or polycide disposed around the thermal oxide layer; a source/drain region formed under the thermal oxide layer and the polysilicon side wall; a field oxide layer under the above stacked structure; and a metallic layer deposited upon the above stacked structure.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

The process for formation of the MOSFET according to the present invention will be described with reference to FIG. 2.

Figure 1:
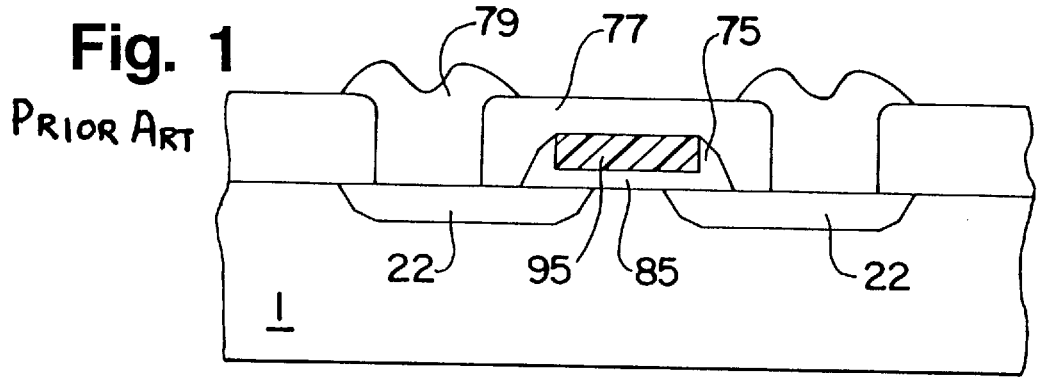
FIG. 1 illustrates the structure of a conventional MOSFET.
Figure 2A:
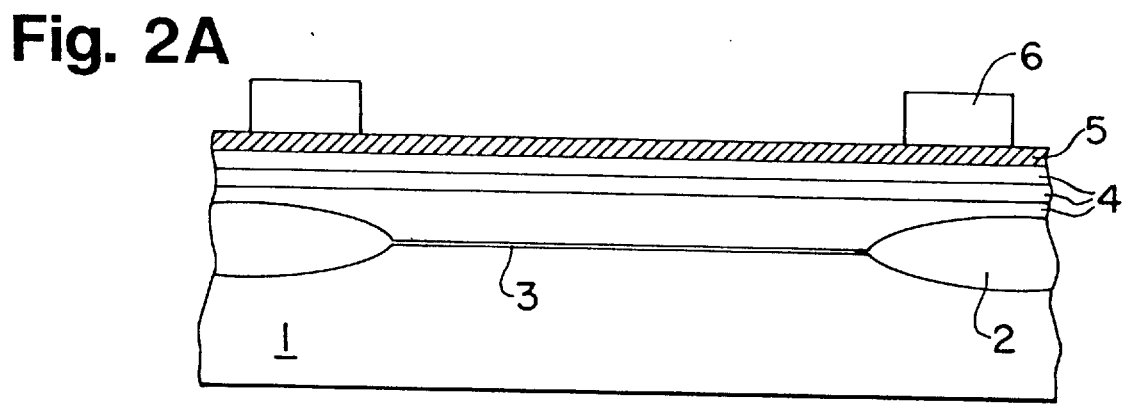
FIGS. 2(A) to 2(H) illustrate the process for formation of a MOSFET in accordance with the present invention.

As shown in FIG. 2(A), field oxide layer 2 is formed upon silicon substrate 1 to define and isolate an active region.

Then, pad oxide layer 3, undoped polysilicon and/or polycide 4 and CVD oxide layer 5 are deposited in the cited order. A portion for forming a MOSFET in the active region is defined using photoresist mask 6.

Figure 2B:
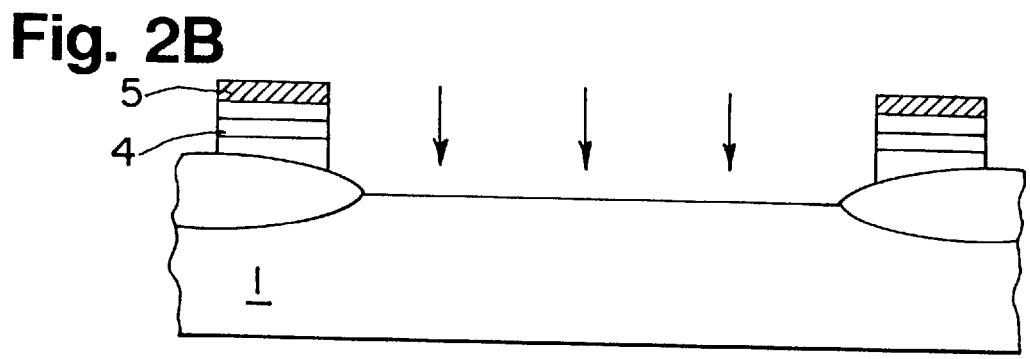
Figure 2C:
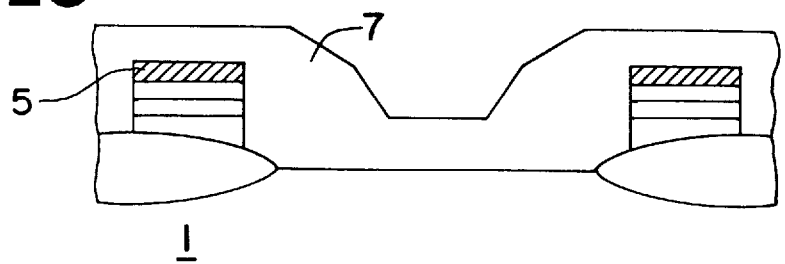

Then, as shown in FIG. 2(B), CVD oxide layer 5, undoped polysilicon and/or polycide 4, and pad oxide layer 3 are etched by applying a reactive ion etching (RIE) process using photoresist mask 6 as a mask, and an ion implantation for the channel is carried out for adjusting the MOSFET threshold voltage. As shown in FIG. 2(C), undoped polysilicon 7 is deposited to a thickness of about 2000 Å.

Figure 2D:
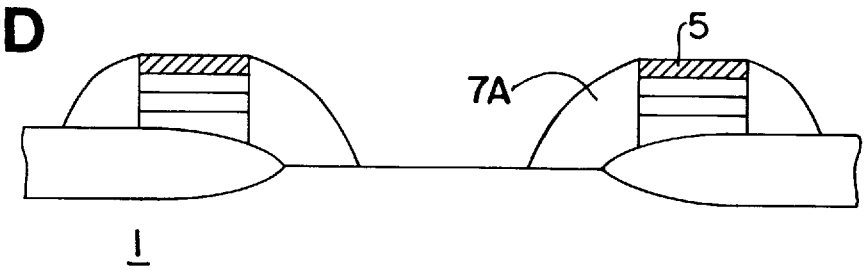

Then, as shown in FIG. 2(D), an RIE process is carried out again (etching back) for forming side wall 7A from undoped polysilicon 7. An annealing process is carried out in order to remedy silicon etch damage, and an oxide layer (not shown) which has grown during the annealing process is removed.

Figure 2E:
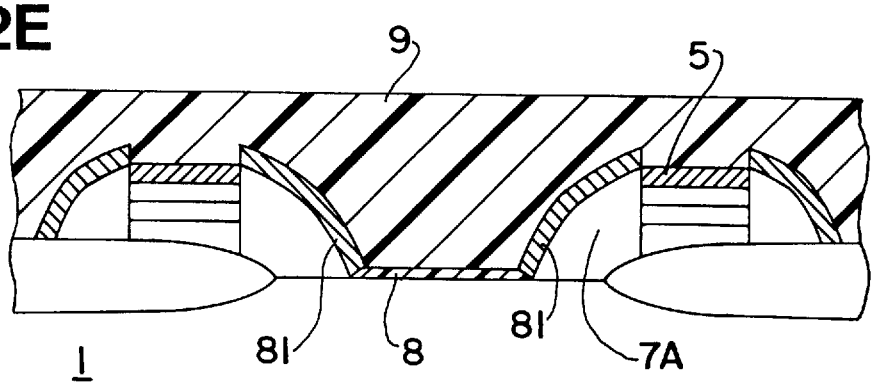

Thereafter, as shown in FIG. 2(E), an oxidation process is carried out to form gate oxide layer 8 and oxide layer 81 on side wall 7A. During this oxidation process, the thickness of oxide layer 81 which is formed on undoped polysilicon side wall 7A is about 3 times the thickness of gate oxide layer 8 which is formed on the silicon substrate. As a result, undoped polysilicon side wall 7A is insulated from those layers which are to be formed later.

If the insulation provided by oxide layer 81 may be insufficient in a particular application, before the oxidation process a thin oxide layer may be deposited to a thickness of about 500 Å after forming side wall 7A of the undoped polysilicon to ensure sufficient insulation of the side wall.

After carrying out the forming process for gate oxide 8, gate polysilicon 9 is deposited.

Figure 2F:
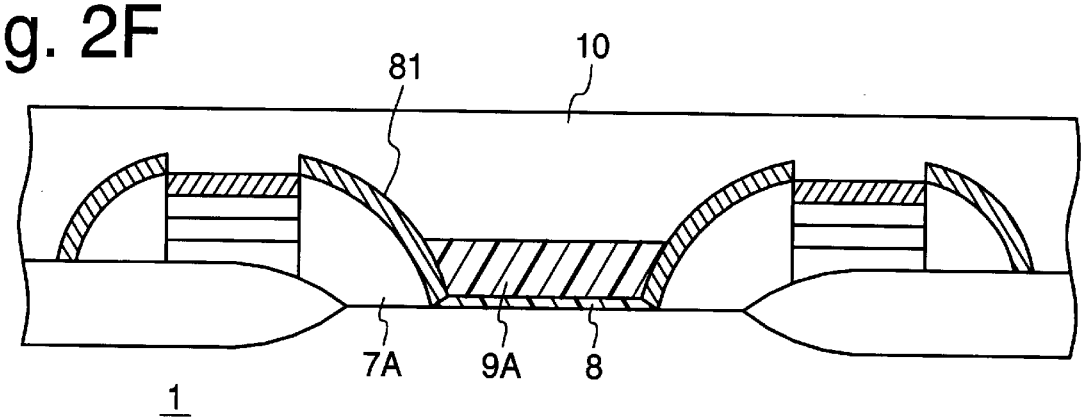

Then, as shown in FIG. 2(F), an RIE process is carried out to pattern gate polysilicon 9 to form gate 9A, and oxide layer 10 for insulating gate 9A is deposited. As illustrated in FIG. 2(F), oxide layer 81 extends to a height greater than that of gate 9A.

Figure 2G:
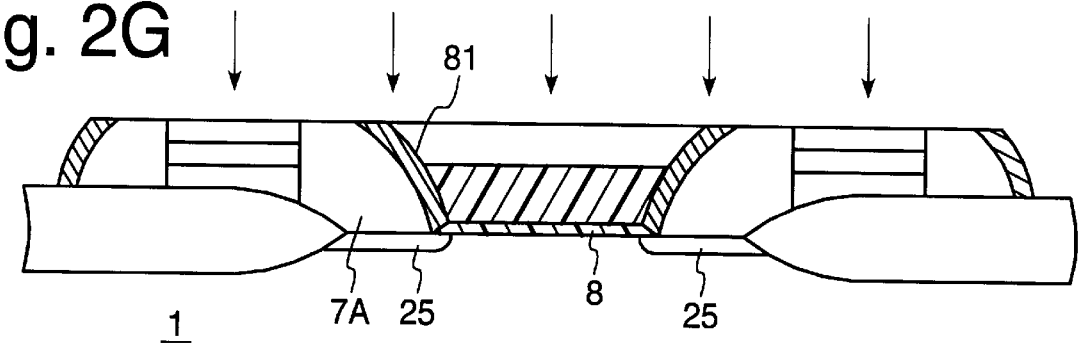

Next, as illustrated in FIG. 2(G), an RIE process is performed on oxide layers 10, 5 and 81, and an RIE process is also performed on the undoped polysilicon in order to flatten the top of side wall 7A of the undoped polysilicon and the other layers as shown. Here, the etching rate between the undoped polysilicon and the oxide layer is desirably 1:1. Thereafter, a source/drain ion implantation is carried out as indicated to form source/drain regions 25. During this process, side wall 7A of the undoped polysilicon also is doped, so that it may become electrically conductive. Also, the implant is self aligned, with gate 9A serving as a barrier to the implant in the channel region. Ions implanted into polysilicon side walls 7A diffuse into the silicon substrate to form the shallow diffusions of source/drain regions 25.

Figure 2H:
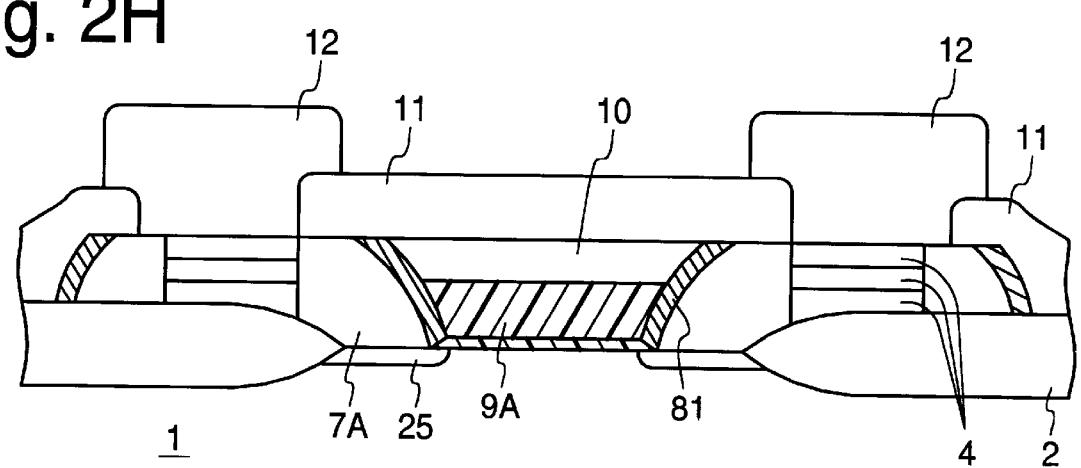

Finally, as shown in FIG. 2(H), oxide layer 11 for serving as an insulating medium is deposited, contact holes for connection of source/drain regions 25 are formed, and metal layer 12 is deposited and patterned to form contact wiring, thereby completing formation of MOSFET.

In the MOSFET of the present invention formed by the above described process, the source/drain regions and the gate are formed in a self aligned form as shown in the sectional view of FIG. 2(H). In the MOSFET of the present invention, the thickness of the gate is very thin unlike that of the conventional MOSFET.

The overall structure of the MOSFET of the present invention is as described below.

That is, a polysilicon gate is formed on a gate oxide layer, and since side gate oxide layer 81 may be formed by an oxidation process, the width of the side gate oxide layer may be very thin.

Side gate oxide layer 81 gradually widens somewhat from bottom to the top. The length of the gate electrode also gradually widens along with the side gate oxide layer.

The gate electrode is surrounded by side gate oxide layer (thermal oxide layer) 81, doped polysilicon side wall 7A, and the stacked structure of an polysilicon and/or polycide 4 on field oxide 2.

The source/drain regions are formed under polysilicon side wall 7A and thermal oxide layer 81 beside the gate.

The field oxide layer is disposed under the stacked structure, and a metallic layer is located upon the stacked structure.

According to the MOSFET and the process for formation thereof as described above, the following advantageous effects may be obtained.

First, a 0.2 $\mu$m scale MOSFET may be manufactured by applying a conventional photolithographic process.

Second, a MOSFET having an actual active region length of about 1 $\mu$m may be manufactured.

Third, the source/drain ion implantation is carried out on undoped polysilicon, and therefore a favorable condition for forming shallow junctions is obtained.

Fourth, a self aligned gate formation process is used, and therefore a photolithographic etching process may be carried out in a simple manner when forming a 0.2 $\mu$m gate.

Fifth, the gate is insulated from the source/drain regions by the thermal oxide layer and side gate oxide layer, and, therefore, gate insulation may be achieved with a minimum thickness of the gate oxide layer.

While a preferred embodiment of the present invention has been illustrated and described, it is anticipated that various changes and modifications will be apparent to those skilled in the art, and that such changes may be made without departing from the spirit and scope of the present invention as defined by the following claims:

What is claimed is:

1. A MOSFET, comprising:

a substrate;

isolation regions formed on the substrate to define an active region in the substrate, the isolation regions comprising a field oxide having a tapered edge adjacent to the active region;

a gate insulating layer formed on the active region;

a tapered gate electrode having first and second sides formed on the gate insulating layer, wherein the top length of the gate electrode is greater than the bottom length of the gate electrode;

first and second tapered conductive regions formed on the substrate and each having a side gate insulating layer formed on each of the first and second tapered conductive regions, wherein the side gate insulating layers and the first and second tapered conductive regions extend to a height greater than the gate electrode, wherein each of the first and second tapered conductive regions is adjacent to a respective side of the tapered gate electrode and extend over the field oxide, and a top insulating layer having a flattened top surface formed over the gate electrode, the side gate insulating layers and the first and second tapered conductive regions, wherein the top insulating layer, the side gate insulating layers and the gate insulating layer insulate the gate electrode;

a source region and a drain region each formed in the substrate beneath a bottom surface of a respective one of the first and second tapered conductive regions; and first and second stacked conducting layers formed on the field oxide, each of the first and second stacked conducting layers abutting a respective one of the first and second tapered conductive regions and making electrical connection with the respective one of the tapered conductive regions and to the respective source region and drain region.

2. The MOSFET of claim 1, wherein the source and drain regions comprise diffusions of impurities from the tapered conductive regions.

3. The MOSFET of claim 1, wherein the first and second stacked conducting layers each comprise a polysilicon layer.

4. The MOSFET of claim 1, wherein the first and second stacked conducting layers each comprise a polycide layer.

5. The MOSFET of claim 1 further comprising a wiring layer connected to each of the first and second stacked conducting layers.

6. A MOSFET comprising:

a gate oxide layer on a silicon substrate and diffusion source/drain regions formed in the silicon substrate beside the gate oxide layer, and a field oxide formed on the silicon substrate, the field oxide having a tapered edge adjacent to each of the source/drain regions;

a polysilicon gate formed on the gate oxide layer, wherein the polysilicon gate extends between the source/drain regions and has a side extending above each of the source/drain regions, wherein the length of the polysilicon gate in cross section gradually widens from bottom to top;

side gate oxide layers formed by oxidation of polysilicon layers adjacent to the sides of the polysilicon gate, wherein the polysilicon layers and side gate oxide layers extend to a height greater than the polysilicon gate, wherein the polysilicon layers extend over and are electrically connected to the source/drain regions, wherein each of the polysilicon layers has a flattened top surface and also extends over the tapered edge of the field oxide, and a top oxide layer having a flattened top surface formed over the polysilicon gate, the side gate oxide layers and the polysilicon layers, wherein the top oxide layer, the side gate oxide layers and the gate oxide layer surround and insulate the polysilicon gate;

stacked conducting layers formed on the field oxide, each of the stacked conducting layers abutting a corresponding one of the polysilicon layers and having a flattened surface of about the same level as the flattened top surface of the corresponding polysilicon layer and making electrical connection with the corresponding polysilicon layer, wherein each of the stacked conducting layers comprise a polycide layer; and a metal wiring layer selectively formed over each of the stacked conducting layers and making electrical connection to each of the stacked conducting layers through a corresponding contact hole in the top oxide layer.

7. A MOSFET comprising;

a substrate;

isolation regions formed on the substrate to define an active region in the substrate, the isolation regions comprising a field oxide having a tapered edge adjacent to the active region;

a gate insulating layer formed on the active region;

a gate electrode having first and second sides formed on the gate insulating layer, wherein the length of the gate electrode in cross section gradually widens from bottom to top of the gate electrode;

first and second impurity diffusion regions formed in the substrate beside the first and second sides, respectively, of the gate electrode in the active region adjacent to the field oxide;

side gate oxide layers formed by oxidation of first and second polysilicon layers adjacent to the first and second sides, respectively, of the gate electrode, wherein the side gate oxide layers and the first and second polysilicon layers extend to a height greater than the gate electrode, wherein each of the first and second polysilicon layers is electrically connected to and extend over a respective one of the first and second impurity diffusion regions and each has a flattened top surface and extend over the tapered edge of the field oxide, and a top oxide layer having a flattened top surface formed over the gate electrode, the side gate oxide layers and the first and second polysilicon layers, wherein the top oxide layer, the side gate oxide layers and the gate insulating layer surround and insulate the gate electrode;

first and second stacked conducting layers formed on the field oxide, each of the first and second stacked conducting layers abutting a respective one of the first and second polysilicon layers and having a flattened surface of about the same level as the flattened top surface of the respective one of the first and second polysilicon layers and making electrical connection with the respective one of the first and second polysilicon layers, wherein each of the first and second stacked conducting layers comprise a polycide layer; and a metal wiring layer selectively formed over each of the first and second stacked conducting layers and making electrical connection to each of the first and second stacked conducting layers through a corresponding contact hole in the top oxide layer, wherein the metal wiring layer is electrically connected to each of the first and second impurity regions of the MOSFET.

8. A MOSFET as claimed in claim 7, wherein the gate electrode comprises polysilicon.

9. A MOSFET as claimed in claim 7, wherein the first and second stacked conducting layers each comprise polysilicon.

10. A MOSFET as claimed in claim 7, wherein the first and second stacked conducting layers each comprise a conducting polysilicon layer connected to a respective one of the first and second impurity diffusion regions, wherein each of the conducting polysilicon layers is electrically connected to the corresponding polycide layer.

11. A MOSFET comprising;

a substrate;

isolation regions formed on the substrate to define an active region in the substrate, the isolation regions comprising a field oxide having a tapered edge adjacent to the active region;

a gate insulating layer formed on the active region;

a gate electrode having first and second sides formed on the gate insulating layer, wherein the top length of the gate electrode is greater than the bottom length of the gate electrode;

first and second impurity diffusion regions formed in the substrate beside the first and second sides, respectively, of the gate electrode in the active region adjacent to the field oxide;

first and second side gate oxide layers formed by oxidation of first and second polysilicon layers adjacent to the first and second sides, respectively, of the gate electrode, wherein the first and second side gate oxide layers and the first and second polysilicon layers extend to a height greater than the gate electrode, wherein each of the first and second polysilicon layers is electrically connected to and extend over a respective one of the first and second impurity diffusion regions and extend over the tapered edge of the field oxide, and a top oxide layer having a flattened top surface formed over the gate electrode, the side gate oxide layers and the first and second polysilicon layers, wherein the top oxide layer, the side gate oxide layers and the gate insulating layer surround and insulate the gate electrode;

first and second stacked conducting layers formed on the field oxide, each of the first and second stacked conducting layers abutting a respective one of the first and second polysilicon layers and making electrical connection with the respective one of the first and second polysilicon layers, and a metal wiring layer selectively formed over each of the first and second stacked conducting layers and making electrical connection to each of the first and second stacked conducting layers through a corresponding contact hole in the top oxide layer, wherein the metal wiring layer is electrically connected to each of the first and second impurity regions of the MOSFET.

12. A MOSFET as claimed in claim 11, wherein the gate electrode comprises polysilicon.

13. A MOSFET as claimed in claim 11, wherein the first and second stacked conducting layers each comprise polysilicon.

14. A MOSFET as claimed in claim 11, wherein the first and second stacked conducting layers each comprise a conducting polysilicon layer electrically connected to a respective one of the first and second impurity diffusion regions, wherein each of the conducting polysilicon layers is electrically connected to a polycide layer.

* * * * *